(12) United States Patent
Yajima

(10) Patent No.: US 9,980,032 B2
(45) Date of Patent: May 22, 2018

(54) EARPHONE DEVICE AND SOUND-REPRODUCING SYSTEM USING THE SAME

(71) Applicant: FOSTER ELECTRIC CO., LTD., Tokyo (JP)

(72) Inventor: Koichi Yajima, Tokyo (JP)

(73) Assignee: FOSTER ELECTRIC CO., LTD., Akishima, Tokyo (JP)

( * ) Notice: Subject to any disclaimer, the term of this patent is extended or adjusted under 35 U.S.C. 154(b) by 0 days. days.

(21) Appl. No.: 15/291,133

(22) Filed: Oct. 12, 2016

(65) Prior Publication Data
US 2017/0188131 A1    Jun. 29, 2017

(30) Foreign Application Priority Data

Dec. 28, 2015    (JP) ................. 2015-255835

(51) Int. Cl.
*H04R 1/10*    (2006.01)
*H01H 3/14*    (2006.01)
(Continued)

(52) U.S. Cl.
CPC ........... *H04R 1/1041* (2013.01); *H01H 3/142* (2013.01); *H01H 9/0228* (2013.01); *H04R 1/1033* (2013.01); *G06F 3/165* (2013.01); *H01H 2003/007* (2013.01); *H01H 2217/012* (2013.01); *H01L 41/113* (2013.01); *H03K 2217/96078* (2013.01); *H04R 1/10* (2013.01); *H04R 5/033* (2013.01)

(58) Field of Classification Search
CPC .... H04R 1/1041; H04R 1/1033; H04R 5/033; H04R 1/10; H01H 9/0228; H01H 3/142; H01H 2217/012; H01H 2003/007; G06F 3/165; H01L 41/113; H03K 2217/96078
See application file for complete search history.

(56) References Cited

U.S. PATENT DOCUMENTS 4,829,571 A * 5/1989 Kakiuchi ............. H04R 1/1033
381/309
5,967,299 A * 10/1999 de Richecour ........ H01H 3/142
200/512
(Continued)

FOREIGN PATENT DOCUMENTS

JP    2015207455    11/2015

*Primary Examiner* — Oyesola C Ojo
(74) *Attorney, Agent, or Firm* — Allen Dyer Doppelt & Gilchrist

(57) ABSTRACT

An earphone device includes first and second earphone bodies into which respective electro-acoustic transducers are built; first and second cables, one end of each of which is connected to the respective earphone body and within each of which a switch member to be turned on by one-way press is disposed over a predetermined range along the length direction of the cable so that the cable has switch functions; wherein a switch is shunted into two switches by the first and second cables, portions of the first and second cables having switch functions are arranged one on top of the other, and an overlapped portion is unidirectionally pressed to simultaneously turn on the respective switches. In addition, a sound-reproducing system is configured by combining a mobile terminal which operates in conjunction with this earphone device.

4 Claims, 12 Drawing Sheets

(51) Int. Cl.
*H01H 9/02* (2006.01)
*H04R 5/033* (2006.01)
*H01L 41/113* (2006.01)
*G06F 3/16* (2006.01)
*H01H 3/00* (2006.01)

(56) References Cited

U.S. PATENT DOCUMENTS

| | | | | |
|---|---|---|---|---|
| 6,898,295 B2 * | 5/2005 | Inamura | | H01B 7/00 |
| | | | | 381/374 |
| 7,534,957 B2 * | 5/2009 | Yamaura | | H03K 17/962 |
| | | | | 174/36 |
| 7,583,508 B2 * | 9/2009 | Hagiwara | | G06F 1/163 |
| | | | | 174/254 |
| 8,094,673 B2 * | 1/2012 | Proctor | | H04R 1/1033 |
| | | | | 370/462 |
| 8,144,915 B2 * | 3/2012 | Hankey | | H01H 9/0228 |
| | | | | 381/370 |
| 8,405,528 B2 * | 3/2013 | Aghaei | | G06F 3/0219 |
| | | | | 174/36 |
| 9,503,802 B2 * | 11/2016 | Kann | | G06F 3/01 |
| 9,704,663 B2 * | 7/2017 | Stanley | | H01H 9/0228 |
| 2007/0237170 A1 * | 10/2007 | Proctor | | H04R 1/1033 |
| | | | | 370/462 |
| 2007/0274530 A1 * | 11/2007 | Buil | | H04R 1/1041 |
| | | | | 381/74 |
| 2009/0257604 A1 * | 10/2009 | Yeates | | H01H 9/0228 |
| | | | | 381/105 |
| 2011/0316611 A1 * | 12/2011 | Gustavsson | | H04R 1/1041 |
| | | | | 327/516 |
| 2013/0102361 A1 * | 4/2013 | Colley | | H04M 1/6058 |
| | | | | 455/557 |
| 2014/0294192 A1 * | 10/2014 | Haynes | | H04R 1/1041 |
| | | | | 381/74 |
| 2016/0100244 A1 * | 4/2016 | Gentile | | H04R 1/1041 |
| | | | | 345/174 |

* cited by examiner

EARPHONE DEVICE AND SOUND-REPRODUCING SYSTEM USING THE SAME

CROSS-REFERENCE TO RELATED APPLICATION

This application claims the benefit of Japanese Patent Application No. 2015-255835, filed on Dec. 28, 2015, the contents of which are herein incorporated by reference in their entirety.

FIELD OF THE INVENTION

This invention relates to an earphone device provided with are earphone body for sound reproduction and a cable having switch functions and connected to this earphone body, and suitably used ire combination with a mobile terminal, and to a sound-reproducing system using this earphone device.

BACKGROUND OF THE INVENTION

The most fundamental embodiment of an earphone connected to a mobile terminal having music-reproducing functions primarily consists of the following components.

First and second earphone bodies each containing an acoustic transducer (unit of a magnetic circuit, diaphragm, or the like); first and second monaural cables connected to each earphone body; and a plug for connection with a mobile terminal disposed on an end of each monaural cable.

One end of each of the abovementioned cables is connected to each earphone body, the plug for connection with a mobile terminal is connected to the other end, portions of the two cables from the intermediate part of the cables to the plug for connection with a mobile terminal are generally bundled into a single cable (hereinafter referred to a third cable), and the cables as a whole are thus formed into a Y shape.

There is also an earphone in which a stopper is disposed in a portion between the first and second cables and the third cable, and which is provided with a slide holder used to prevent the cables from being entangled when the earphone is housed or suit the earphone to a users preferences.

In addition, there is an earphone further provided with a controller including manual operation buttons (switches) used to operate the playback functions of a mobile terminal, such as "Vol.+", "Vol.−", "Play, Pause" and the like.

This controller is disposed on a cable between connectors used to connect an earphone body and a mobile terminal. In some of controllers provided with a microphone for speech communication in particular, the microphone for speech communication is located in a position close to lips and suited for a call, i.e., the first and second cables closer to the earphone body.

As the first and second cables, a cable switch serving as a control switch is disclosed in an earphone which incorporates radio functions, as shown in Japanese Patent Laid-Open No. 2015-207455 (Patent Literature 1), in addition to prior and existing commonly-known cables.

This switch is not such that the switch is disposed in a specific place of the cable. Instead the cable has switch functions over an effective range in the length direction of the cable. Thus, the cable is structured so as to be able to perform switching operation (switch-on) no matter which place of the cable is pressed within that range. This type of switch is referred to as a cable switch.

CITATION LIST

Patent Literature

Patent Literature 1: Japanese Patent Laid-Open No. 2015-207455

In contrast to the switches of a controller disposed in a specific place of a cable, the cable switch has the advantage of having a wide range of operation feasible by press and being easy to operate.

If switch functions, such as "Vol.+", "Vol.−", "Play, Pause", of a plurality of systems are allocated on the same cable, however, there arises the need to indicate ranges (locations) to be pressed on a function-by-function basis to a user. This is liable to degradation in the freedom of design. The cable switch also has the problem in which even if the ranges (locations) are indicated to the user, it is cumbersome to operate the cable switch while observing indications under the condition of earphone bodies being put in ears. In addition, the user may perform false operation if the user does not observe the indications.

SUMMARY OF THE INVENTION

An object of the present invention, which has been proposed in view of the aforementioned problems, is to provide an earphone device in which a cable switch is applied to an earphone to make it easy even for a user who uses the earphone device for the first time to operate the earphone device, and which includes switch parts in three places, so that these three parts are selected and pressed as appropriate when necessary, thereby allowing desired operations to be easily performed, is less liable to false operation, and eliminates the need to, for example, indicate operating ranges.

Another object of the present invention is to provide a sound-reproducing system for reproducing sound in combination with a mobile terminal which operates in conjunction with this earphone device.

According to an embodiment of the present invention, an earphone device is provided with a first earphone body in which an electro-acoustic transducer is built; a first cable one end of which is connected to this first earphone body and within which a switch member to be turned on by one-way press is disposed over a predetermined range along the length direction of the cable so that the cable has switch functions; a second earphone body in which an electro-acoustic transducer is built; and a second cable one end of which is connected to this second earphone body and within which a switch member to be turned on by one-way press is disposed over a predetermined range along the length direction of the cable so that the cable has switch functions, wherein a switch is shunted into two switches by the first and second cables, portions of the first and second cables having switch functions are arranged one on top of the other, and an overlapped portion is unidirectionally pressed to simultaneously turn on the respective switches.

The first and second cable switches are completely shunted to the left and right of a user, when in use, and can be turned on no matter which portion of either cable is pressed. Thus, the earphone device has the advantageous effect of being easy to use and less liable to false operation. The earphone device also has the advantageous effect in which a portion where the two first and second cable switches are overlapped can be used as a third switch.

According to an aspect of the present invention, insertion holes in which portions of the first and second cables on the other end side having switch functions can be arranged one on top of the other are formed, the cables are inserted through a holder deformable by press, and the cables are simultaneously made conductive by pressing the holder to function as a switch. A user can easily recognize that a portion of the earphone device where the holder is positioned is the third switch.

According to another aspect of the present invention, the holder is slidable within at least a partial range having the switch functions of the first and second cables. Accordingly, the switch functions of the first and second cable switches and the third switch function can be allocated according to the preferences of a user.

According to a further aspect of the present invention, a sound-reproducing system is combined with a mobile terminal which operates in conjunction with the earphone device. A user can easily and securely perform various operations, including turning up and down the sound volume of the mobile terminal, without false operation, to reproduce and enjoy sound.

BRIEF DESCRIPTION OF THE DRAWINGS

FIG. 1A is a perspective view of an earphone device according to the present invention, whereas

DETAILED DESCRIPTION OF PREFERRED EMBODIMENTS

Figure 1A:
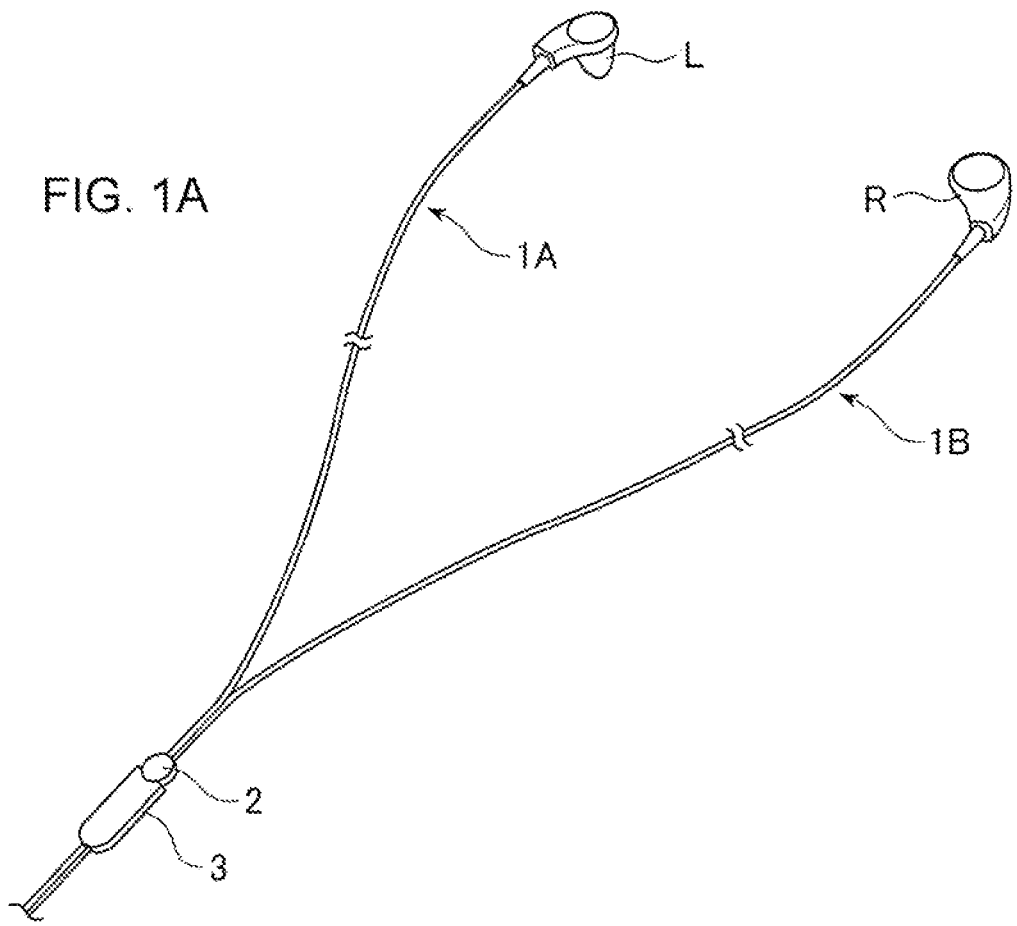

FIG. 1A illustrates a basic configuration of an earphone device according to the present invention. Reference character L denotes a first earphone body to be put in, for example, a left ear, whereas reference character R denotes a second earphone body to be put in a right ear. Electro-acoustic transducers are built in the earphone bodies L and R. Each of these electro-acoustic transducers is composed of a driving unit including a magnet, a coil and the like, and a vibrating unit provided with a diaphragm connected to the coil. Heretofore-known appropriate electro-acoustic transducers may be adopted and assembled in the earphone device.

Figure 1B:
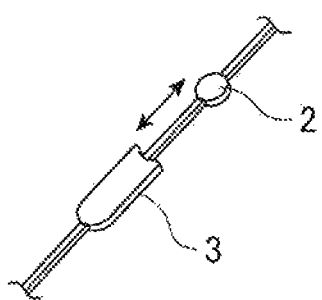
FIG. 1B is a partial perspective view illustrating the operation of a holder.
Figure 2:
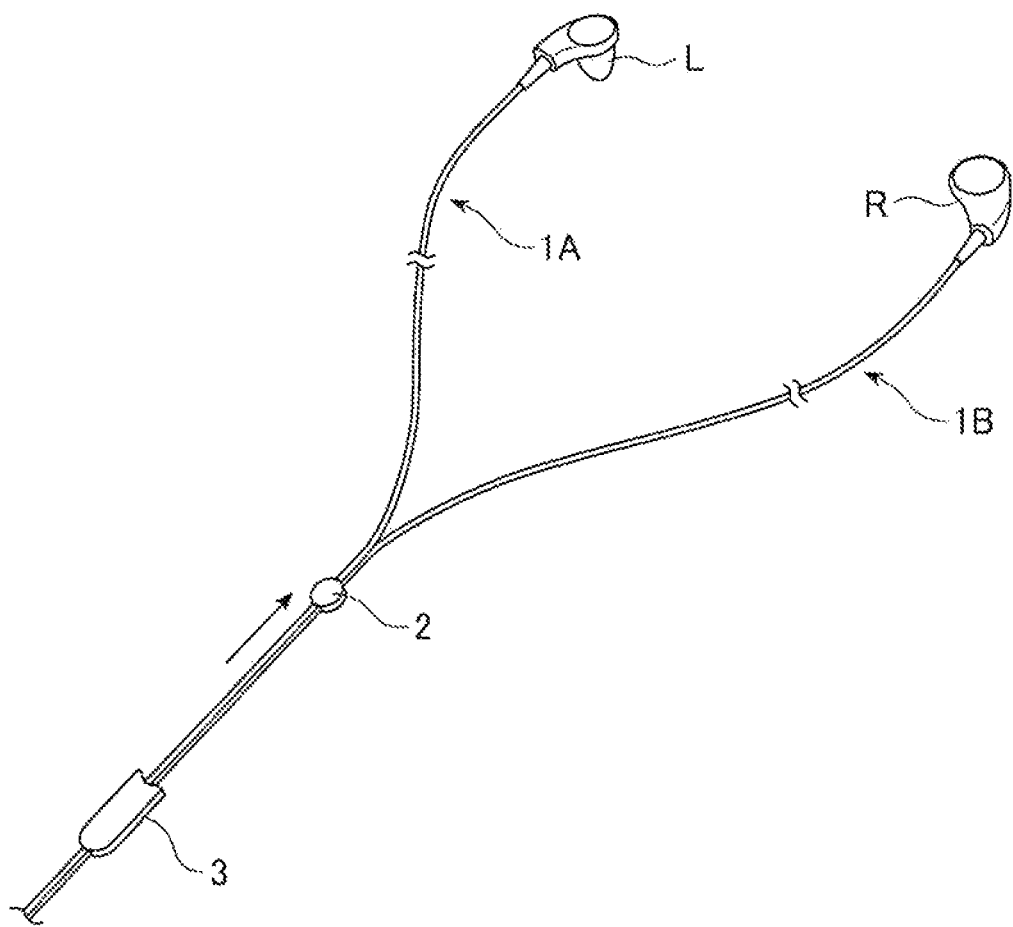
FIG. 2 is a perspective view of the condition of the holder moved.

Reference character 1A denotes a first cable containing a first cable switch one end of which is connected to the first earphone body L, whereas reference character 1B denotes a second cable containing a second cable switch connected to the second earphone body R. The other ends of these cables 1A and 1B are inserted through a slidable holder 2 as illustrated in FIGS. 1B and 2. Reference numeral 3 denotes a stopper for restricting the slide of the holder 2. A switch circuit is assembled in the stopper 3, the first and second cable switches are connected to the switch circuit and a lead wire and an LR signal line to be connected to the GND and SW (MIC) terminals of a plug connected from the switch circuit to the mobile terminal are housed in a single sheath and drawn out from the lower end of the stopper 3. The switch circuit, plug, sheath and the like will be described later.

Figure 3:
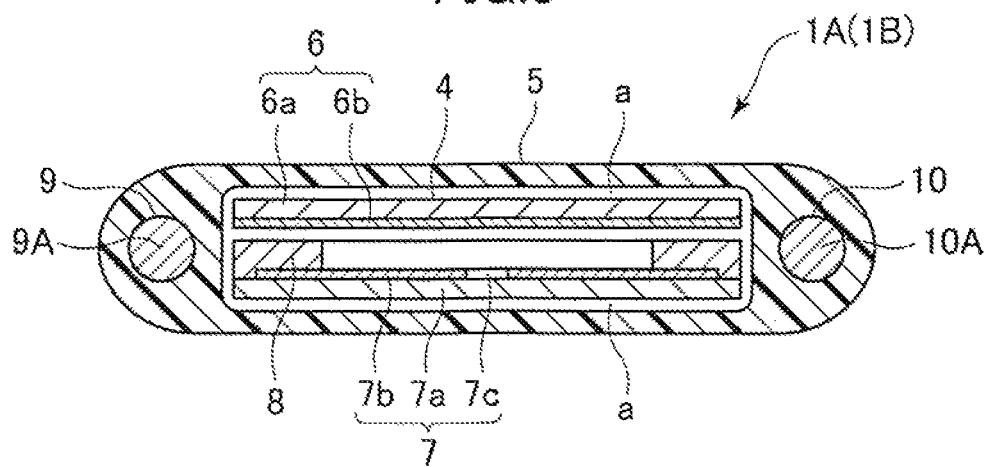
FIG. 3 is a vertical cross-sectional view illustrating the internal structure of a cable switch suitably used in the present invention.

FIG. 3 is a vertical cross-sectional view illustrating the internal structures of the first and second cables 1A and 1B.

These cables 1A and 1B have a configuration in which a belt-like conductor film 4 functioning as a switch is contained in a flat, tubular sheath 5.

The belt-like conductor film 4 is composed of a first conductor film 6 positioned on the upper side under the illustrated condition, a second conductor film 7 disposed oppositely to this first conductor film 6 at a distance therefrom and positioned on the lower side, and an insulating spacer 8 disposed between these first and second conductor films 6 and 7.

The first conductor film 6 is composed of a first belt-like base material 6a made of an insulating member, and a first conductor 6b disposed on an inner surface (corresponding to the lower surface under the illustrated condition) of this first belt-like base material 6a in a belt-like manner.

The second conductor film 7 is composed of a second belt-like base material 7a also made of an insulating member, and a second conductor 7b disposed on an inner surface (corresponding to the upper surface under the illustrated condition) of this second belt-like base material 7a in a belt-like manner.

The insulating spacer 8 arranged between these first and second conductor films 6 and 7 serves to maintain a gap between the conductor films so that the belt-like base materials 6b and 7b of the conductor films do not come into contact with each other.

The flat, belt-like bendable sheath 5 is made from TPE (thermoplastic elastomer). This sheath 5 includes therein a substantially rectangular hollow cavity through which the belt-like conductor film 4 composed of the first and second conductor films 6 and 7 and the insulating spacer 8 can be inserted. The belt-like conductor film 4 is housed in the hollow cavity. Note that + and − signal line insertion holes 9 and 10 are formed on both outer sides of the hollow cavity, i.e., both widthwise ends of the sheath 5. A cable with a built-in switch is thus configured by inserting + and − signal lines 9A and 10A through those holes.

The hollow cavity is formed so as to be larger than the external shape of the belt-like conductor film 4, so that the belt-like conductor film 4 can be housed in the cavity with adequate margins. Note that the width of the hollow cavity has to be kept to a minimum to the extent that the insulating spacer 8 can maintain a gap between the first and second belt-like base materials 6b and 7b.

The insulating spacer 8 is formed using resist on the outer end of the second conductor 7b dual-partitioned by a slit 7c. A method of applying solder resist, a coverlay or the like used in commonly-known FPCs is desirably adopted at the time of forming the insulating spacer. That is, resist or a coverlay is directly joined and fixed to a base material or a conductor through an adhesive agent. Accordingly, resist or a coverlay for use in FPCs for which bending is assumed is formed to be sufficiently thinner than a base material using a flexible material, so that when in use, any excessive stress is not applied to a conductor or the base material when a conductor film is deformed and that an insulator is not partially delaminated off.

Figure 4:
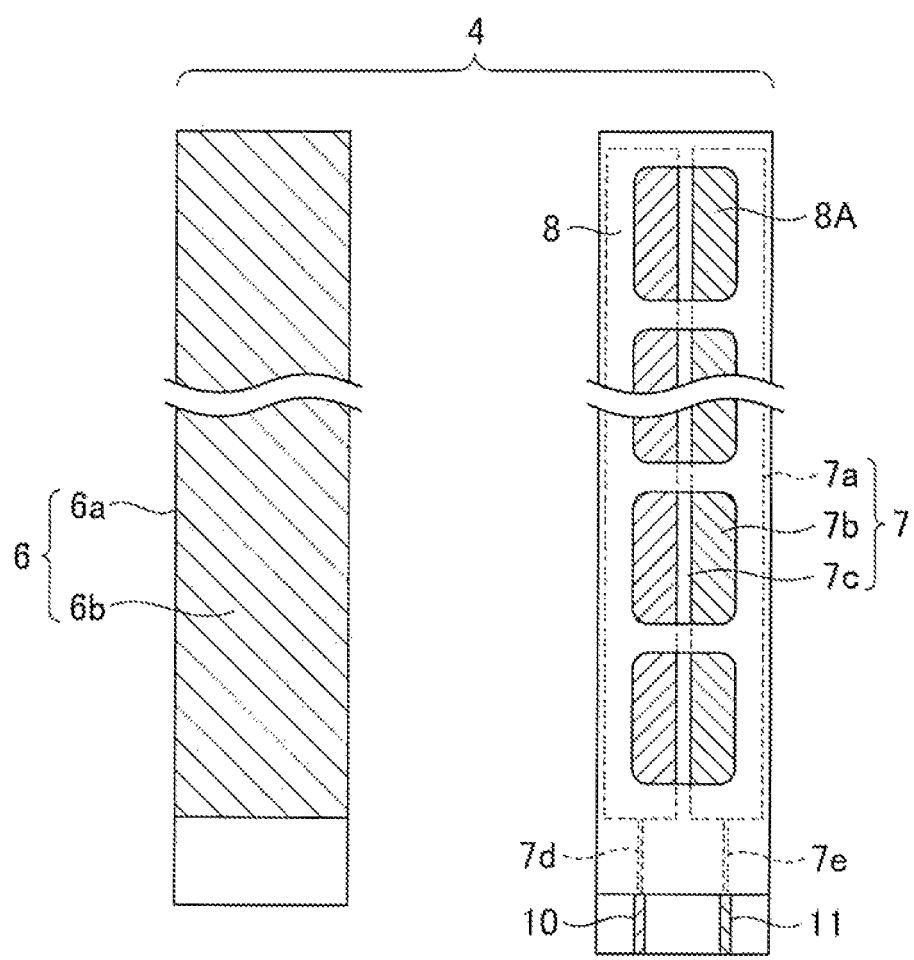
FIG. 4 is a development view illustrating the constituent members of the belt-like conductor film of the abovementioned cable switch.

FIG. 4 is a development view illustrating the constituent members of the belt-like conductor film 4. The first conductor 6b is disposed on an inner surface of the first belt-like base material 6a constituting the first conductor film 6. The second conductors 7b serving as + and − electrodes are disposed on an inner surface of the second belt-like base material 7a constituting the second conductor film 7 through the slit 7c, Leads 7d and 7e and connecting electrodes 10 and 11 are formed on ends of the second conductors 7b. The first conductor 6b works as a jumper part capable of connecting the + and − second conductors 7b and 7b.

The insulating spacer 8 has a predetermined thickness, and windows 8A having, for example, a rectangular shape are formed into a ladder-like shape at predetermined intervals along the length direction of the spacer. The first and second conductor films 6 and 7 are brought into contact with each other by press within this window 8A.

At the time of assembly, the first conductor film 6 is movably overlaid on the second conductor film 7 including the insulating spacer 8 in the length direction, and the belt-like conductor film 4 composed of this subassembly is inserted in the sheath 5. The reason for movably overlaying the first conductor film 6 is to make the conductor film easy to bend. Another reason is that the first conductor film 6, when bended, is allowed to become displaced accordingly in the length direction with respect to the insulating spacer 8 disposed on the second conductor film, without deforming toward the second conductor film 7 side. Note that since the ins elating spacer 8 is present between the first and second conductor films 6 and 7, the first and second conductor films 6 and 7, when bended, do not come into contact with and become conductive to each other. Thus, the cable switch does not cause false operation.

Figure 5:
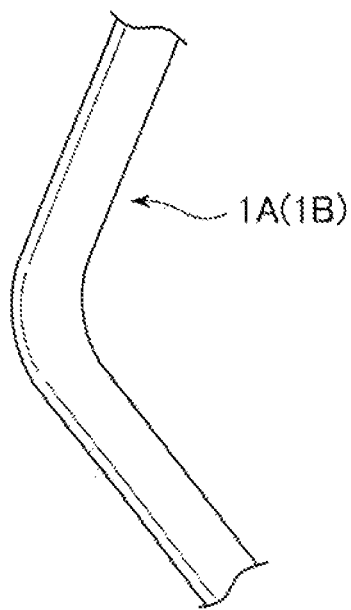
FIG. 5 is a perspective view illustrating the bent state of a cable containing a cable switch.

FIG. 5 is a partial perspective view of the bent states of the cables 1A and 1B.

Figure 6:
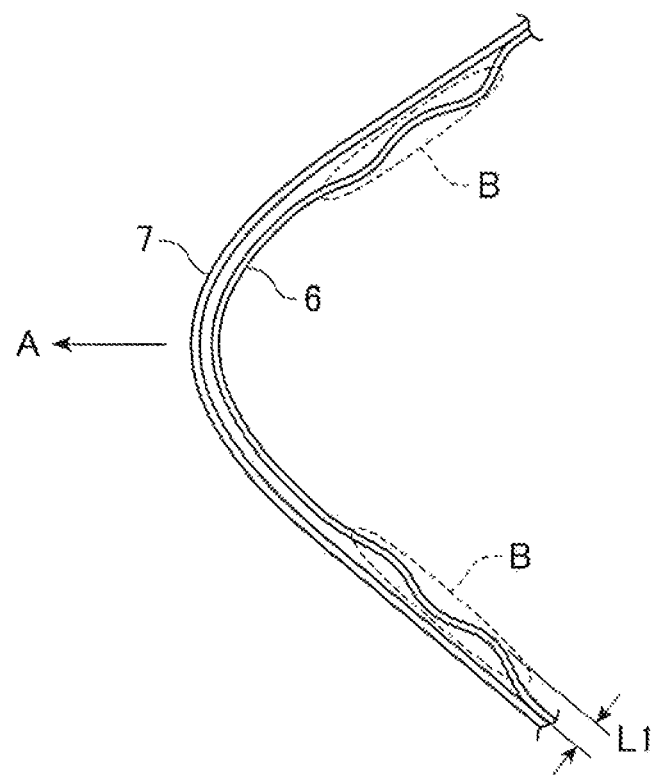
FIG. 6 is n explanatory drawing illustrating the conditions of first and second conductor films which are constituent members of the cable switch in the abovementioned bent state.

As illustrated in FIG. 6, the first conductor film 6 positioned on the inner side of the sheath 5 in FIG. 5 has flexure with respect to the direction of bending if each cable s bended in the direction of an arrow A. Thus, such wavy sections B as shown by dashed lines may arise. Unless a runout of these wavy sections B corresponding to a dimension L1 is formed in the spatial part of the sheath, the first conductor film 6 may come into contact with the opposed second conductor film 7 to conduct electricity.

Hence a spatial part a for absorbing the wavy sections B in the thickness direction of the spatial part is formed in the spatial part of the sheath, as shown by reference character a in FIG. 3 so that the first and second conductor films 6 and 7 do not involuntarily come into contact with each other due to bending to cause false operation. Note that FIG. 6 illustrates the conditions of the first and second conductor films 6 and 7 at the time of bending, where the spacer 8 is excluded from the figure as a matter of convenience of description.

According to the cables 1A and 1B thus configured, the built in cable switch does not malfunction in response to bending.

Figure 7:
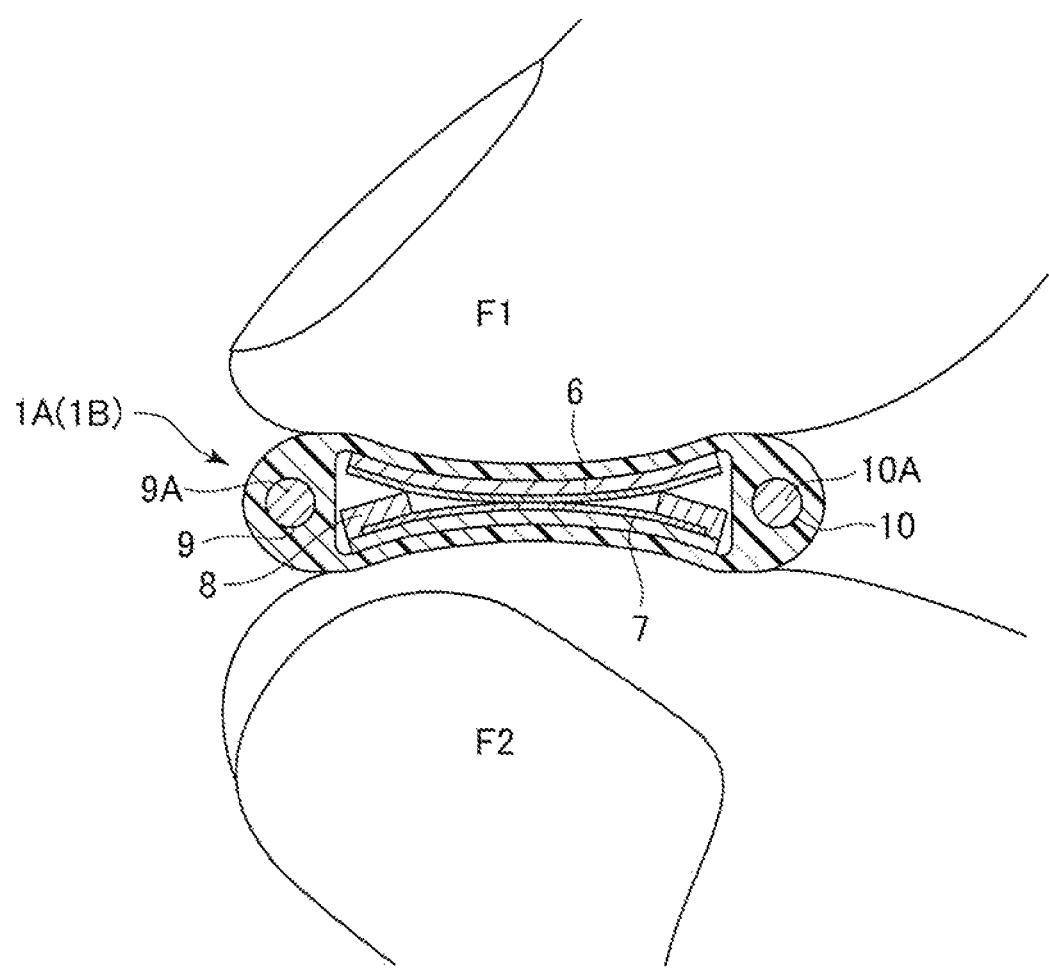
FIG. 7 illustrates the pressed state of the cable switch.

The cable switches built in these cables 1A and 1B do not turn on in response to bending. Each cable switch is configured to turn on, however, as the result of the cable being pinched with, for example, a forefinger F1 and a thumb F2 and pressed unidirectionally, as illustrated in FIG. 7, thereby bringing the first and second conductor films 6 and 7 functioning as a switch member into contact with each other to conduct electricity.

Note that a + side signal line 9A and a − side signal line 10A, for example, are inserted in the insertion holes 9 an 10 of the sheath 5, respectively, to configure the cables 1A and 1B.

Figure 8:
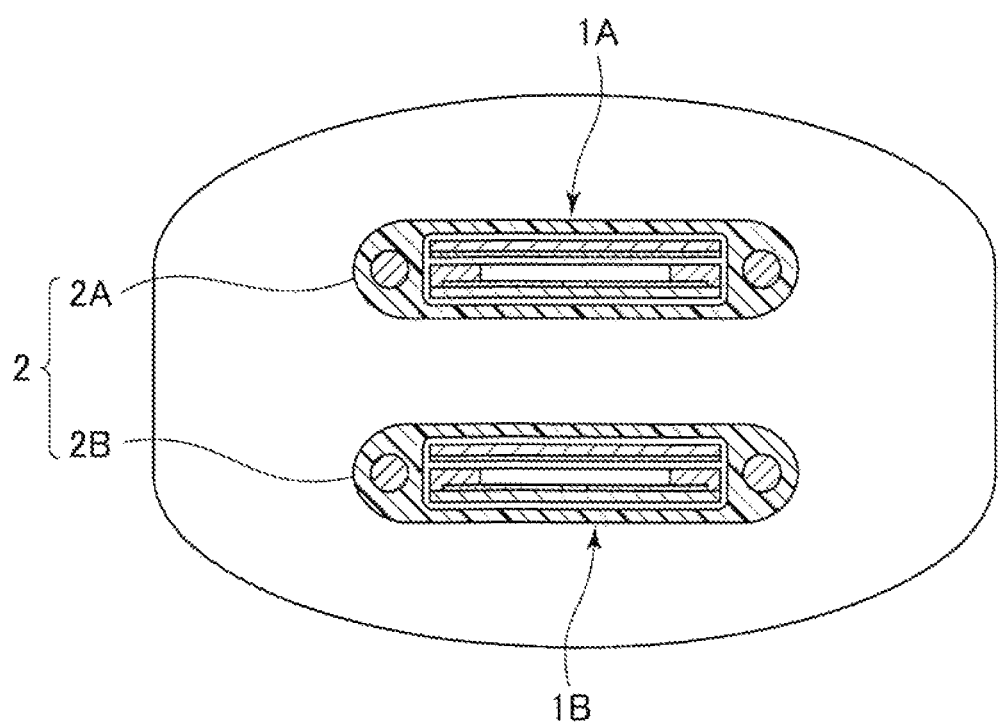
FIG. 8 is an explanatory view of the cable switch set in the holder of the present invention.

The first and second cables 1A and 1B configured as described above are inserted through the holder 2, as illustrated in FIG. 8. That is, under the illustrated condition, first and second cable insertion holes 2A and 2B are formed in the upper and lower sections of the holder 2. The internal shapes of these cable insertion holes 2A and 2B are conformal to the external shapes of the cables 1A and 1B. Thus, the cables 1A and 1B are slidably inserted through the cable insertion holes. Note that the insertion holes 2A and 2B are not limited to the above-described configuration. Alternatively, the two cable switches may be stacked so that the cable switches can be simultaneously turned on by one-way press. For example, the insertion holes 2A and 2B may be formed into a single substantially rectangular insertion hole.

This holder 2 is preferably also formed from TPE or the like. This TPE has the nature of being soft and easy to deform.

Figure 9:
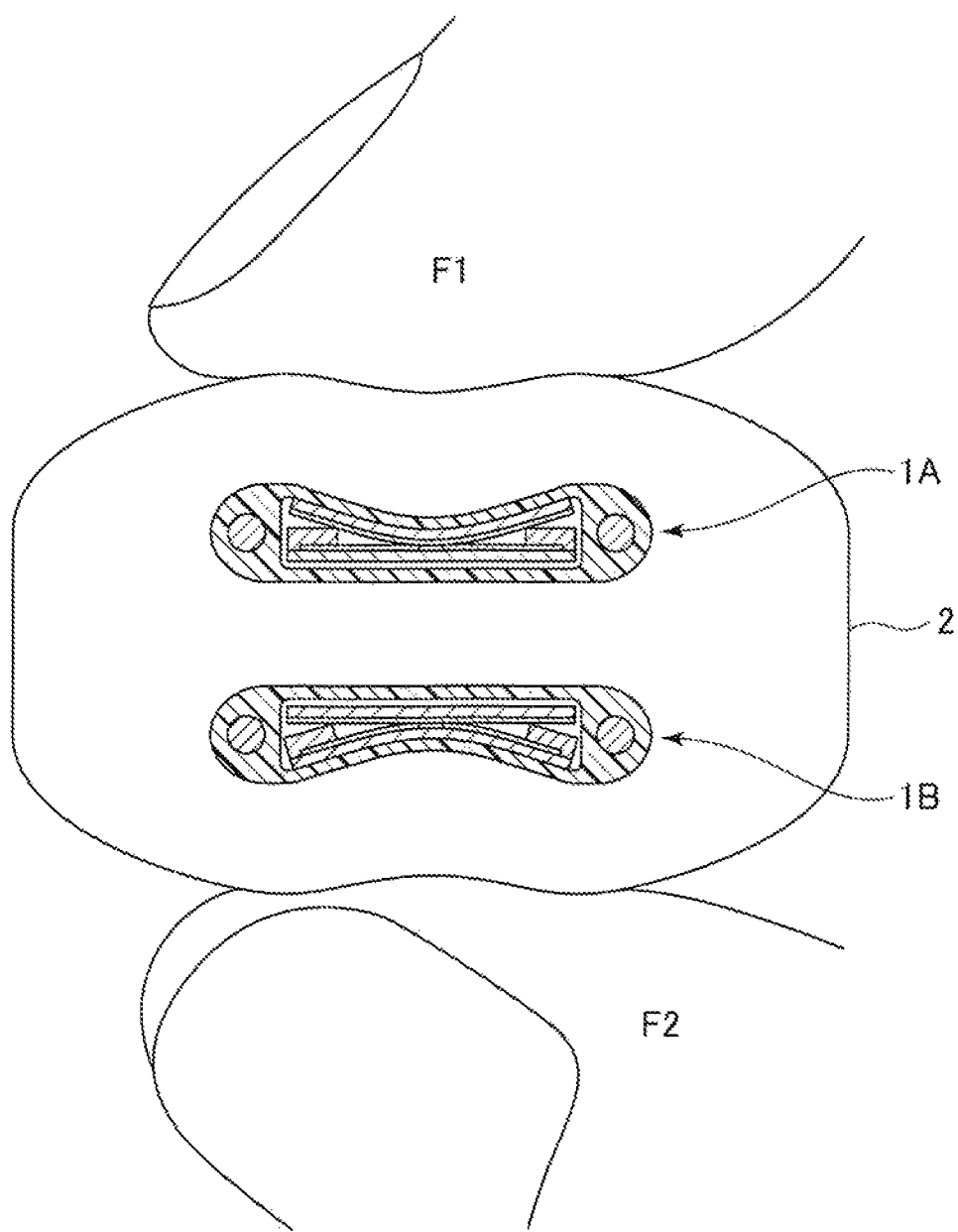
FIG. 9 illustrates the pressed state of the abovementioned holder.

Accordingly, the built-in first and second cables 1A and 1B are simultaneously pressurized by pinching the upper and lower surfaces of the holder 2 with a forefinger F1 and a thumb F2 and pressing and squeezing the deformable holder 2 in one direction, i.e., in the thickness direction as illustrated in FIG. 9. Thus, the first and second conductor films 6 and 7 come into contact with each other, and the cables can be simultaneously made conductive. Releasing the finger from the holder 2 causes the holder to revert to its original state due to the force of restitution ascribable to the material of the holder.

As a matter of course, an elastic member other than TPE may be used as the material of the holder 2.

Figure 10:
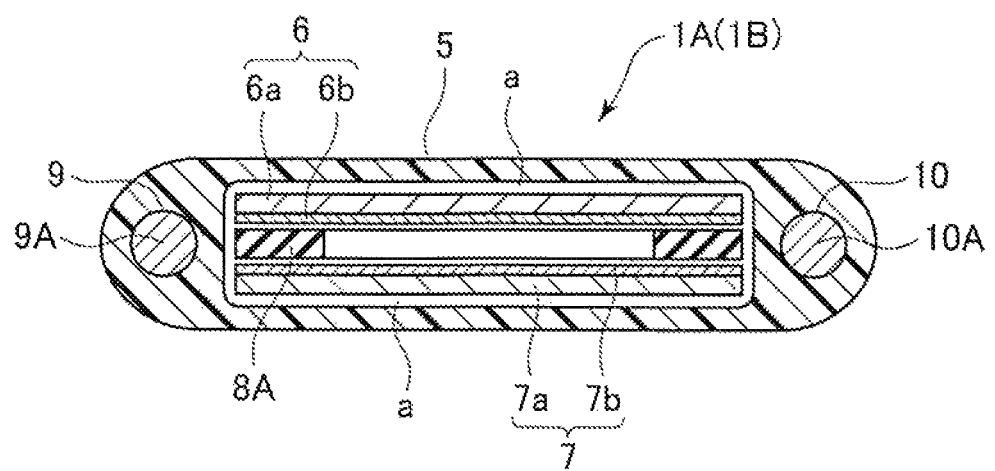
FIG. 10 is a configuration example of another cable switch.

Note that in the foregoing discussion, an example is cited in h each insulating spacer 8 of the cable switches built in the cables 1A and 1B is formed on the second belt-like base material 7a using resist. Alternatively, an insulating spacer of such a type in which separately-formed insulating spacers 8A are overlaid on the second conductor 7b, as illustrated in FIG. 10, may be used. Yet alternatively, the second conductor 7b may be defined as, for example, a negative electrode and the first conductor 6b as a positive electrode, without forming the slit 7c shown in FIG. 3 on the second conductor 7b.

Figure 11:
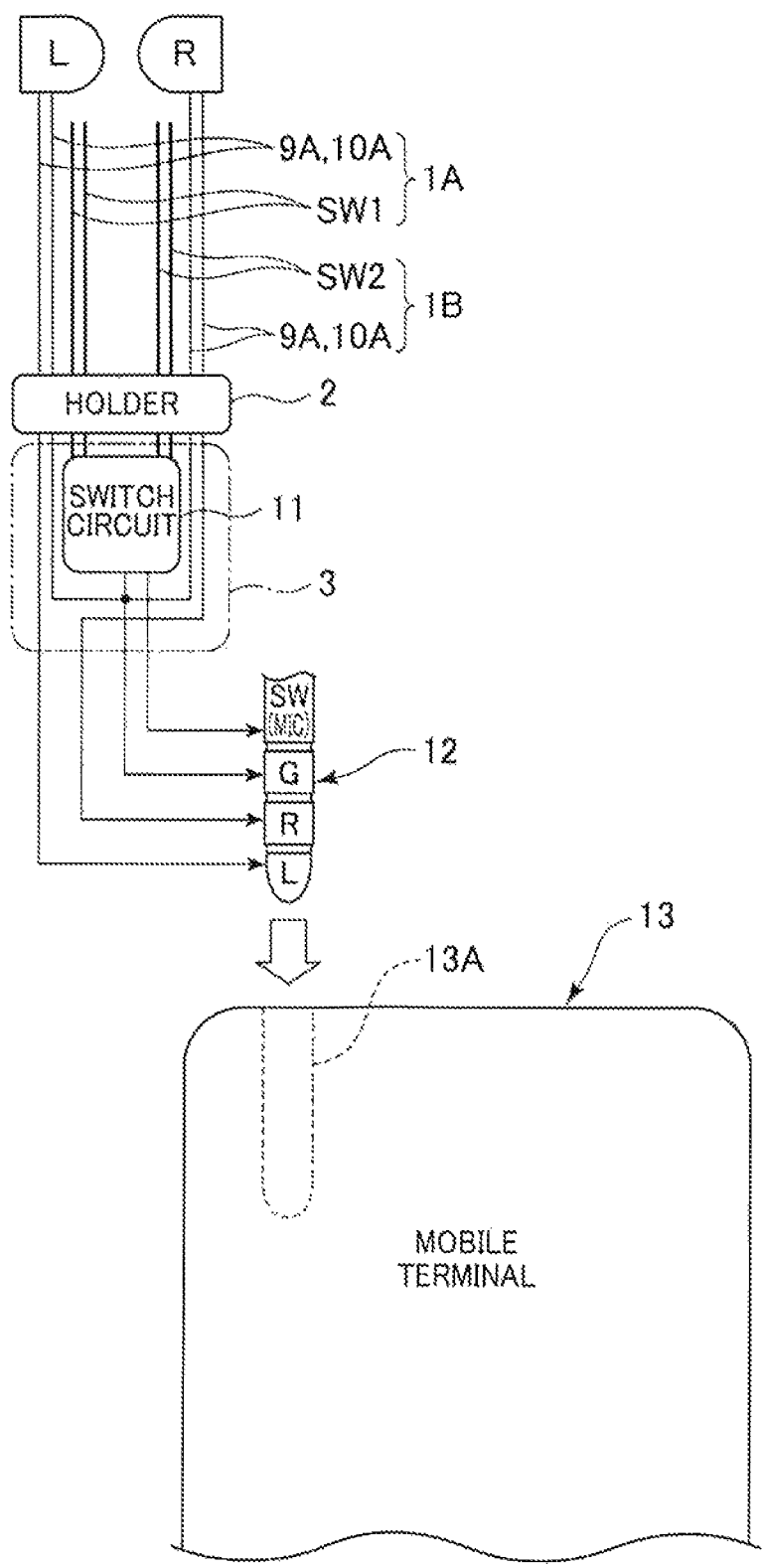
FIG. 11 illustrates a first embodiment of a sound-reproducing system using are earphone device according to the present invention.

FIG. 11 illustrates a first embodiment of a sound-reproducing system in which the above-described earphone device according to the present invention is combined with mobile terminal. In the figure, an SW1 and an SW2 correspond to the first and second conductor films 6 and 7 of the first and second cables 1A and 1B illustrated in FIG. 3. The first and second conductor films 6 and 7, when brought into contact with each other, conduct electricity and serve as switches. The conductor films are therefore represented here as the SW1 and SW2.

In addition, the left-side part of FIG. 11 represents a first cable 1A functioning as the first switch SW1. The left-side part shows that one end of each of, for example, a + side signal line 9A and a − side signal line 10A inserted through the sheath 5 shown FIG. 3 is connected to a first earphone body L. The right-side part of FIG. 11 shows that one end of each of the signal line 9A and the signal line 10A within a cable provided with the second switch SW2 corresponding to the second conductor film 7 of the second cable 1B is likewise connected to a second earphone body R.

The first and second cables 1A and 1B are bundled and inserted through the holder 2 while being overlapped, where this holder 2 functions as a third switch. The SW1 and SW2 of the first and second cables 1A and 1B drawn out from the holder 2 are connected to a switch circuit 11 housed in the stopper 3. Lines and the respective signal lines 9A and 10A outgoing from the switch circuit 11 are connected to predetermined portions of a plug 12.

A heretofore-known mobile terminal 1 incorporates music-reproducing functions and is provided with a jack to which earphones having microphone functions can be connected. The plug 12 connected to this mobile terminal 13 is provided with a terminal L used to supply audio signals from the mobile terminal 13 to the left-side first earphone body L, a terminal R used to supply audio signals from the mobile terminal 13 to the right-side second earphone body R a terminal SW (MIC) used to supply audio signals from microphone to the mobile terminal 13 when the microphone is used, and a ground terminal G. Note that a DC bias voltage for electrical power supply to a microphone is applied to the input terminal of the mobile terminal-side microphone at the time of connection. In addition, this voltage enables a change in the values of resistance connected to the terminal SW (MIC) and the ground terminal G to be detected on the mobile terminal side, thereby allowing the mobile terminal to accordingly take a specific action. This plug 12 freely attachable to and detachable from a jack 13A of the mobile terminal 13.

When the plug 12 is connected to the mobile terminal the signal lines 9A and 10A of the first cable 1A send an audio signal from the terminal L to the left-side first earphone body L. Likewise, the signal lines 9A and 10A of the second cable 1B send an audio signal from the terminal R to the right-side second earphone body R.

When the sound-reproducing system is in use, the resistance of the switch circuit 11 changes if the first cable 1A is pressed and made conductive, the second cable 1B is pressed and made conductive, or the holder 2 is pressed. Thus, the system operates according to the change. As described above, in the present invention, a switch is shunted to the left-side first cable 1A and the right-side second cable 1B. In addition, since portions of the first and second cables 1A and 1B having switch functions are overlapped at the movable holder 2 in the central part of the earphone device the holder when pressed, functions as a third switch. Thus, switching points are provided in three places, i.e., the left and right-side parts and the central part of the earphone device, to prevent false operation and make the earphone device easy to use.

When in operation, the switch circuit 11 changes in resistance to a predetermined value if the SW1 of the first cable 1A is closed. When the sound volume of the mobile terminal is turned up, the switch circuit turns up the sound volume of an audio signal to be sent to the first earphone body L. If the SW2 of the second cable 1B is closed, the switch circuit 11 changes in resistance to a predetermined value different from the abovementioned value. If the predetermined value means "turning down the sound volume," the switch circuit turns down the sound volume of an audio signal to be sent to the second earphone body R. If the holder 2 is pressed, the SW1 and the SW2 are simultaneously closed, and the switch circuit 11 changes in resistance to a predetermined value even different from the abovementioned value. Thus, the switch circuit is configured to enable reproduction (Play)/interruption (Pause), according to the predetermined value.

Such a switch circuit 11 as described above can be easily configured with a circuit formed by combining passive elements, including resistors. The switch circuit 11 can also be configured with a circuit formed using active elements, including FETs, that operate by utilizing a bias power supply for the microphone of the mobile terminal. Active elements are desirably used if the resistance of a cable switch itself largely differs from the resistance of a conventional controller.

In any of the configurations, the switch circuit may be configured to change to predetermined resistance values corresponding to the respective switches when the first switch of the first cable 1A, the second switch of the second cable 1B, or the third switch which is a part where the portions of the respective cables having switch functions are overlapped is closed. Then, the state of the switch circuit may be determined at the mobile terminal connected to the switch circuit. Examples of this switch circuit will be described later.

As described above, signals from the mobile terminal 13 are sent to the first and second earphone bodies and R by inserting the plug 12 in the jack 13A. If a microphone (not illustrated) is included in the system, signals of the microphone are sent to the mobile terminal 13.

The mobile terminal 13 is configured to turn up or down the sound volume or interrupt (Pause) while performing music reproduction, or perform music reproduction (Play) or the like while interrupting music reproduction, if a predetermined resistance value (given a certain degree of allowance) changes. In addition, the mobile terminal 13 has various functions, including advancing music being reproduced to another during, a period time in which the switch circuit is maintained at the abovementioned resistance value or if the switch circuit changes to that resistance value a plurality of times within a specific period of time.

Some of heretofore-known earphones have remote control functions, so that a user can operate the mobile terminal by connecting the earphones to the terminal. In these earphones, a controller provided with three systems of switches is disposed midway through an earphone cable. A switch circuit is built in the controller, so as to change to a predetermined resistance value when each switch is pressed.

Figure 12:
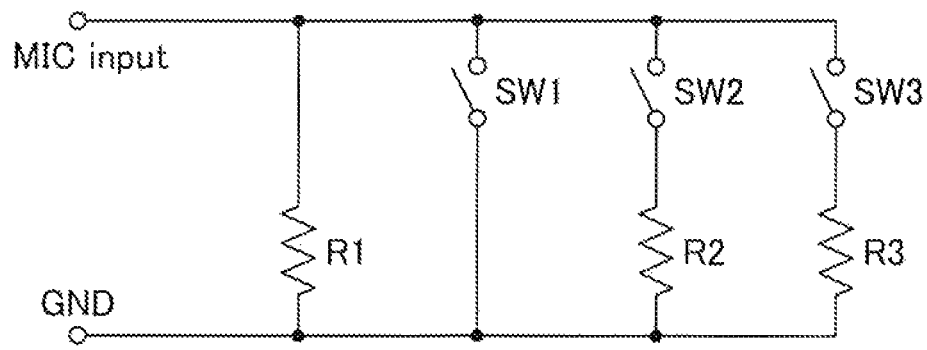
FIG. 12 is one example of a switch circuit of the abovementioned sound-reproducing system.

FIG. 12 is an example of a switch circuit using the passive elements discussed above. In this circuit, an SW3 and a resistor 2 are interposed in series between a microphone input terminal (MIC Input) and a ground terminal (GND). The switch circuit is configured by connecting a series circuit of a resistor R1, an SW1, an SW2 and the resistor 2 in parallel with this series circuit.

The resistance value of this switch circuit equals the resistance value of the resistor R1 when none of the switches is pressed. The resistance value of the switch circuit equals zero when the SW1 is pressed, equals $R1 \times R2/(R1+R2)$ when the SW2 is pressed, and equals $R1 \times R3/(R1+R3)$ when the SW3 is pressed. The SW3 corresponds to the part where the portions of the first and second cables 1A and 1B having switch functions are overlapped. As long as these circuit resistance values are adjusted to the previously-set values of the mobile terminal 13 to be connected to the switch circuit, a user can perform operations, such as music reproduction, at the user's fingertips when using the earphones. That is, the switch circuit enables such operations as turning up sound volume when the SW1 is pressed, turning down sound volume when the SW2 is pressed, replaying when the SW3 is pressed, and stopping replay when the SW3 is pressed during replay.

In the present invention the first cable 1A is configured to operate as the first switch SW1 over a range in which a cable switch is built in the first cable. Likewise, the second cable 1B is configured to operate as the second switch SW2 over a range in which a cable switch is built in the second cable. In this case, the holder 2 can be moved to optionally adjust the operating range of the switches of the first and second cables 1A and 1B.

If the mobile terminal 13 to be connected is of an existing type, the switch circuit may be configured so as to be set to the resistance values of a conventional remote controller switch (switch circuit) by the above-described switch operations.

Note that a wide variety of cable switches is available. Some of the cable switches e greater in the resistance value of a switch itself than the switches of the remote controller of the abovementioned conventional earphones. Accordingly, the switch circuit is desirably configured with a circuit using FETs and the like, rather than the circuit composed solely of passive elements illustrated in FIG. 12. This is not the case, however, for dedicated mobile terminals and the like in which the defined values of circuit resistance for a mobile terminal to operate card be previously set to adjust the terminal to the characteristics of a switch circuit utilizing cable switches on the terminal side.

Figure 13:
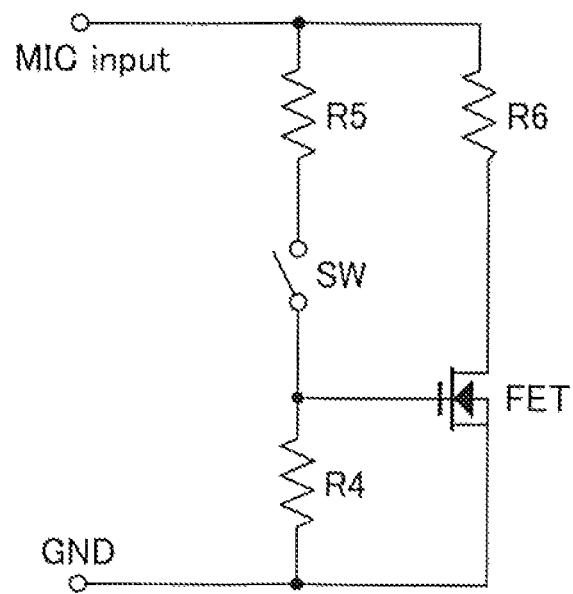
FIG. 13 another example of the switch circuit.

FIG. 13 is an example of a switch circuit using an active element, such as an FET. This circuit is configured by interposing a resistor R6 and an FET between a microphone input terminal and a ground terminal, connecting a series circuit of an FET bias resistor R5, a switch SW and a resistor R4 in parallel with the resistor R6 and the FET, and connecting the gate of the FET to an intermediate point between the switch SW and the resistor R4.

If this circuit is used for the switch SW1 (represented as SW in the figure), pressing the SW1 (SW) causes the FET to operate and set the circuit resistance to R6.

In the present invention, switches themselves are composed of only two systems of switches, i.e., the SW1 and SW2 of the first and second cables 1A and 1B, where the condition of these two switches being simultaneously pressed is defined as the third switch SW3. Accordingly, the switch circuit 11 is configured to be able to represent resistance values equivalent to those of the switch circuit of conventional earphones by changing the value of the resistor R6 and applying the same circuit to the SW2, in addition to the SW1 circuit illustrated in FIG. 12, placing these circuits in parallel with the SW1 circuit, connecting the SW1 and SW2 further to the input of a logic circuit to define the logical product (AND) thereof as the SW3, and further configuring the same circuit as the circuit using the FET illustrated in FIG. 13 and setting the circuit with the circuits placed in parallel.

Figure 14:
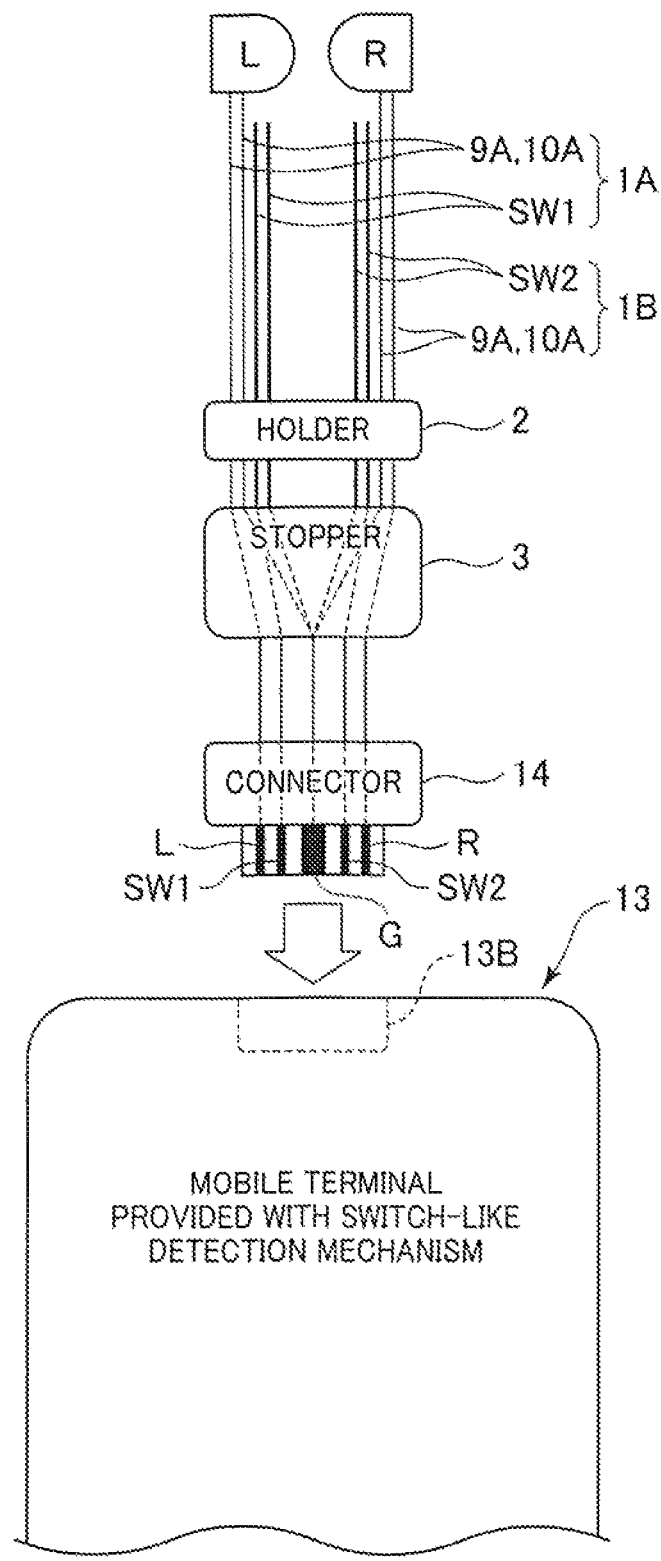
FIG. 14 illustrates a second embodiment of the sound-reproducing system using an earphone device according to the present invention.

FIG. 14 illustrates a second embodiment of the sound-reproducing system using an earphone device according to the present invention. This embodiment is an example in which the switch circuit is connected to a mobile terminal different from the above-described heretofore-known mobile terminal. Unlike the first embodiment, the switch circuit is not disposed on the earphone side but on the mobile terminal 13 side.

In addition, respective lines outgoing from the holder 2 are connected through a stopper 3 to a connector 14 for connection with the mobile terminal. The ground lines of signal lines 9A and 10A and the SW1 and SW2 of the first and second cables 1A and 1B are connected to a common terminal G of the connector 14, whereas other lines are connected to the connection parts L, R, SW1 and SW2 of the connector 14. Also in this embodiment, a user can easily perform switch operations. It is also possible to reduce the weight of the earphone device since the switch circuit is not present on the earphone side, thereby improving the comfort of wear.

Figure 15:
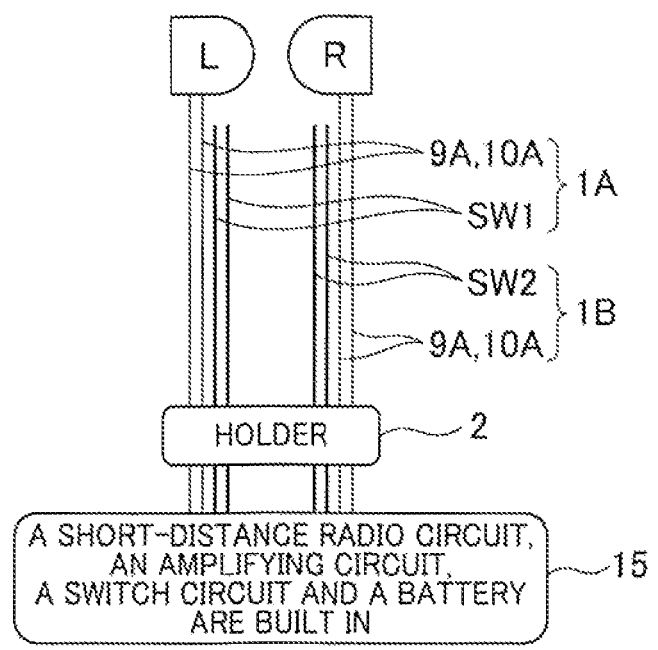
FIG. 15 illustrates a third embodiment of the sound-reproducing system using an earphone device according to the present invention.

FIG. 15 illustrates a third embodiment of the sound-reproducing system using an earphone device according to the present invention. In this embodiment, a short-distance radio circuit, an amplifying circuit, a switch circuit, a battery and the like are built in the stopper 15 of the earphone device. A mobile terminal (not illustrated) can be connected to the earphone device by allowing the mobile terminal to have short-distance radio functions the same in standards as the earphone device. In this case, the system may be configured so as to be able to send data indicated by a switch circuit in the earphone device to the mobile terminal within the range of radio communication standards.

DESCRIPTION OF SYMBOLS

L: First earphone body
R: Second earphone body
1A: First cable
1B: Second cable
2: Holder
3: Stopper
4: Belt-like conductor film
5: Sheath
6: First conductor film
7: Second conductor film
8: Insulating spacer
9, 10: Signal line insertion hole
9A, 10A: Signal line
11: Switch circuit
12: Plug
13: Mobile terminal
14: Connector
15: Stopper
SW1: First switch
SW2: Second switch
SW3: Third switch

What is claimed:

1. An earphone device comprising:
a first earphone body in which an electro-acoustic transducer is built;
a first cable one end of which is connected to the first earphone body and within which a first cable switch is disposed over a predetermined range along the length direction of the first cable, the first cable switch being activatable by a unidirectional press over the entire predetermined range of the first cable;
a second earphone body in which an electro-acoustic transducer is built; and
a second cable one end of which is connected to the second earphone body and within which a second cable switch is disposed over a predetermined range along the length direction of the second cable, the second cable switch being activable by a undirectional press over the entire predetermined range of the second cable;

wherein portions of the first and second cable switches are overlapped, a first switch function is effected by a unidirectional press of a non-overlapped portion of the first cable switch, a second switch function is effected by a unidirectional press of a non-overlapped portion of the second cable switch, and a third switch function is effected by a unidirectional press of the overlapped portions of the first and second cable switches.

2. The earphone device according to claim 1, further comprising a holder deformable by press, the overlapped portions of the first and second cable switches being located within the holder.

3. The earphone device according to claim 2, wherein the holder is slidable over at least part of the respective predetermined ranges of the first and second cable switches in length directions of the first and second cables.

4. A sound-reproducing system configured as a combination of a mobile terminal and an earphone device according to claim 1.

* * * * *